United States Patent [19]

Babanezhad

[11] Patent Number: 5,006,817
[45] Date of Patent: Apr. 9, 1991

[54] RAIL-TO-RAIL CMOS OPERATIONAL AMPLIFIER

[75] Inventor: Joseph N. Babanezhad, Campbell, Calif.

[73] Assignee: Sierra Semiconductor, San Jose, Calif.

[21] Appl. No.: 420,937

[22] Filed: Oct. 13, 1989

[51] Int. Cl.⁵ .............................................. H03F 3/45
[52] U.S. Cl. ................................. 330/253; 330/255; 330/258; 330/311
[58] Field of Search ................. 330/253, 255, 258, 311

[56] References Cited

PUBLICATIONS

De La Plaza et al., "Power Supply Rejection in Differential Switched-Capacitor Filters", IEEE Journal of Solid-State Circuits, vol. SC-19, No. 6, Dec. 1984, pp. 912-918.

*Primary Examiner*—James B. Mullins
*Attorney, Agent, or Firm*—Nathan N. Kallman

[57] ABSTRACT

A CMOS operational amplifier comprises an output gain stage including output transistors coupled between the rails so that for a given amount of current, the output transistors have rail-to-rail gate-to-source voltages. The output transistors can be made smaller in size with the output stage being capable of driving a small resistive load with minimal signal distortion.

12 Claims, 3 Drawing Sheets

RAIL-TO-RAIL CMOS OPERATIONAL AMPLIFIER

FIELD OF THE INVENTION

This invention relates to an operational amplifier and in particular to a rail-to-rail CMOS amplifier having a rail-to-rail voltage range at its input and output.

BACKGROUND OF THE INVENTION

Description of the Prior Art

Prior art CMOS operational amplifiers were designed as transconductance amplifiers and also as general purpose operational amplifiers. Transconductance amplifiers are limited to driving capacitive loads only. General purpose operational amplifiers are able to drive resistive as well as capacitive loads.

Presently known operational amplifiers include output stages with limited driving capability, particularly when driving small resistive loads, because the gate-to-source voltage ($V_{gs}$) of the output devices is lmited. To realize the capability of higher current driving, large size output transistors and a relatively high gate-to-source voltage are required.

When designing integrated circuits, a major objective is to use physically smaller components in order to make the circuit assembly more compact. Therefore, one goal in the implementation of integrated circuits is to use smaller size transistors than those found in conventional circuits, but yet to achieve optimum operating characteristics of the circuit with good current driving capability. However, in presently known operational amplifiers, large size transistors are employed to achieve high current driving capability for small resistive loads which is mostly due to limited gate-to-source voltage.

SUMMARY OF THE INVENTION

An object of this invention is to provide a CMOS operational amplifiier having an output stage with high current driving capability for driving small resistive loads.

Another object of this invention is to provide a CMOS operational amplifier having smaller output transistors in its output stage and a more compact integrated circuit.

According to this invention a CMOS operational amplifier comprises a common made mode input stage, a differential-output input stage, a common mode feedback stage, an output biasing stage and an output stage. The common mode input stage regulates the variations in power dissipation of the operational amplifier with relation to the input common mode range, and also reduces changes in open-loop gain and phase margin relative to the common mode input. The differential output, differential-input stage, which has a folded-coscode configuration, achieves a wide common mode input range. The balanced differential-output of the input stage can swing rail-to-rail and has a common mode voltage so that a quiescent current is generated in the output transistor. The common mode feedback circuit establishes the values of the dc voltage of the two differential outputs of the differential-output input stage.

The novel output stage of the operational amplifier disclosed herein comprises P-channel and N-channel transistors coupled between the drain voltage rail and source voltage rail. In operation, when the output gain stage needs to draw maximum sinking current, the negative differential voltage applied as an input to the N-channel output transistor can swing all the way to the positive rail voltage $V_{DD}$ resulting in a rail-to-rail gate-to-source voltage for the N-channel output transistor. To achieve the sourcing condition, the positive differential input voltage swings to the positive rail voltage $V_{DD}$ forcing a transistor that is tied to the negative rail voltage $V_{SS}$ into the linear region where it has a small $V_{DS}$. Thus the P-channel output transistor can have a large gate-to-source voltage. As a result of the complimentary nature of the differential outputs of the differential-output input stage, when one of the outputs is close to the rail voltage $V_{DD}$, the other output is close to the rail voltage $V_{SS}$. Siince the output transistors of the output stage can have rail-to-rail gate-to-source voltages, the output transistors can be made with smaller sizes for any given amount of output current.

BRIEF DESCRIPTION OF THE DRAWINGS

The invention will be described in detail with reference to the drawing in which.

DESCRIPTION OF THE PREFERRED EMBODIMENT

Figure 1:
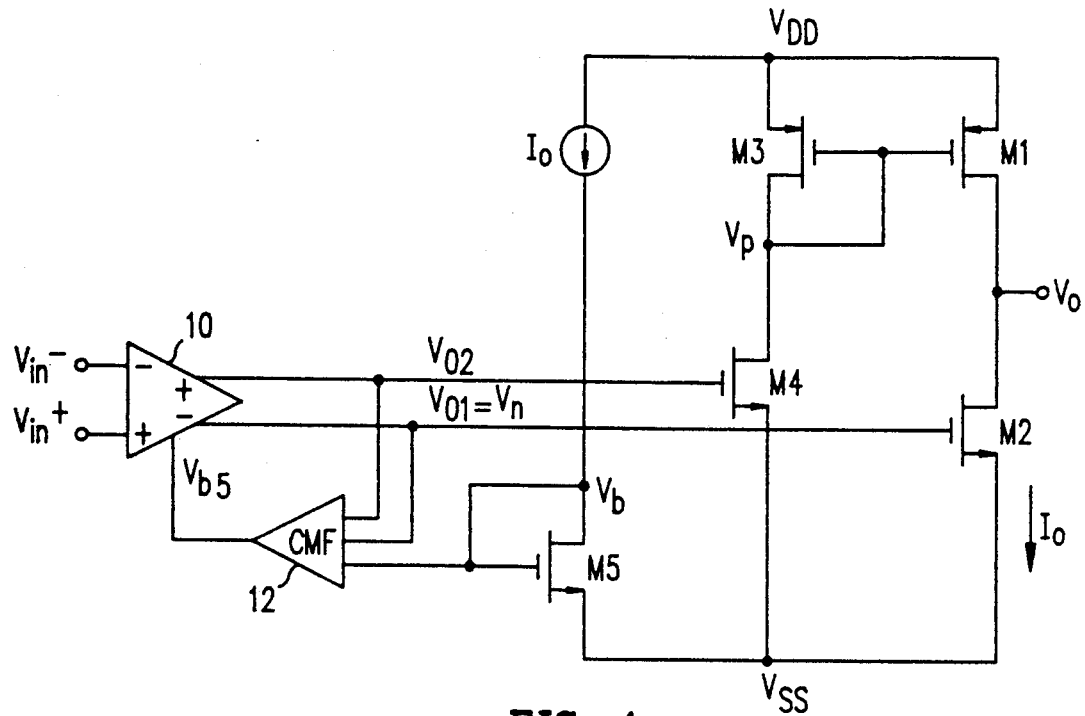
FIG. 1 is a schematic and block circuit diagram representing the novel output stage of the operational amplifier, including the input stage and biasing section, in accordance with this invention.

With reference to FIG. 1, an output stage of an operational amplifier (op amp) comprises a differential amplifier 10 which recieves differential voltage signals $V_{in-}$ and $V_{in+}$. The outputs of the amplifier 10 are an amplified inverted differential signal $V_{o}2$ of positive polarity that is applied to the gate electrode of metal oxide semiconductor field effect transistor (MOSFET) M4 and an inverted differential signal $V_{01}$ of negative polarity $V_n$ that is applied to the gate of an N-channel output transistor M2 at the output stage.

A common-mode feedback amplifier circuit 12 is coupled to receive the $V_{02}$ and $V_{01}$ differential signals and a voltage signal $V_b$ representing the quiescent current $I_Q$ between $V_{DD}$ and $V_{ss}$. The common-mode feedback amplifier provides a feedback signal to the differential amplifer 10. The common mode feedback circuit 12 establishes the DC voltage values of the two differential outputs from the amplifier 10. Thus it is seen that $V_{01}=V_{02}=V_n=V_b$, where $V_b$ is the bias voltage and $V_n$ is the gate voltage applied to the N-channel transistor M2 in the output stage. Assuming that $(W/L)_{M1}/(W/L)_{M3}=(W/L)_{M2}/(W/L)_{M4}$, where W is the width and L is the length of the transistors, the output current $I_o$ in the output stage is defined as $I_o=[(W/L)_{M2}/(W/L)_{M5}]I_Q$, which can be made independent of the power supply.

When the output stage needs to draw its maximum sinking current, $V_0=V_n$ can swing all the way to $V_{DD}$ thereby providing a rail-to-rail gate-to-source voltage for the N-channel output transistor $M_2$. When operating in the sourcing mode, $V_{02}$ swings to $V_{DD}$ forcing M4 into the linear region. As a result, the M4 drain voltage $V_p$ moves close to $V_{ss}$ thus providing a large $V_{gs}$ for the P-channel output transistor M1. By selecting the proper transconductance parameters and the threshold voltage for the N-channel and P-channel transistors, the size $(W/L)_{M4}$ relative to $(W/L)_{M3}$ can be increased so that $(V_{gsM1})_{max}$ approaches the rail-to-rail voltage, since the differential outputs of the input stage are complementary, when one of the output volatges is close to $V_{DD}$, the other output voltage is close to $V_{ss}$. Thus when one of the output transistors M1 or M2 is heavily conducting, the other transistor is off. In this manner, the output transistors M1 and M2 can have smaller sizes for a given amount of current because they can have rail-to-rail $V_{gs}$ voltages.

The output stage has a balanced differential input that can swing rail-to-rail and with a common mode voltage $V_n$ that realizes a given quiescent current in the transistors M1 and M2 of the output stage. When driving small resistive loads, the output stage has low gain and therefore the input stage must provide a large voltage gain.

Figures 2, 2A:
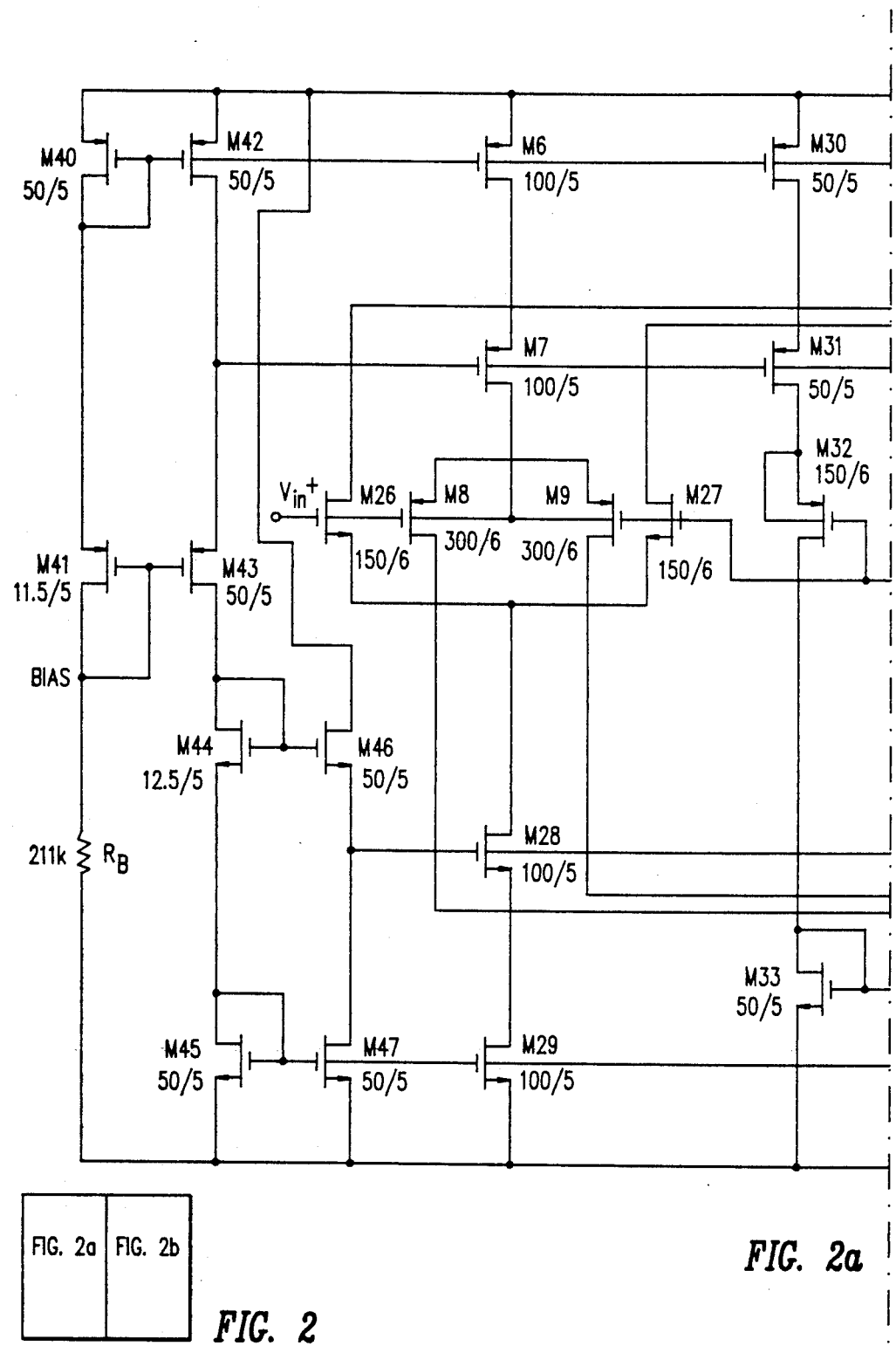
FIG. 2 shows the relationship between FIGS. 2a and 2b, which are schematic circuit diagrams of the operational amplifier incorporating the novel output stage of FIG. 1.
Figure 2B:
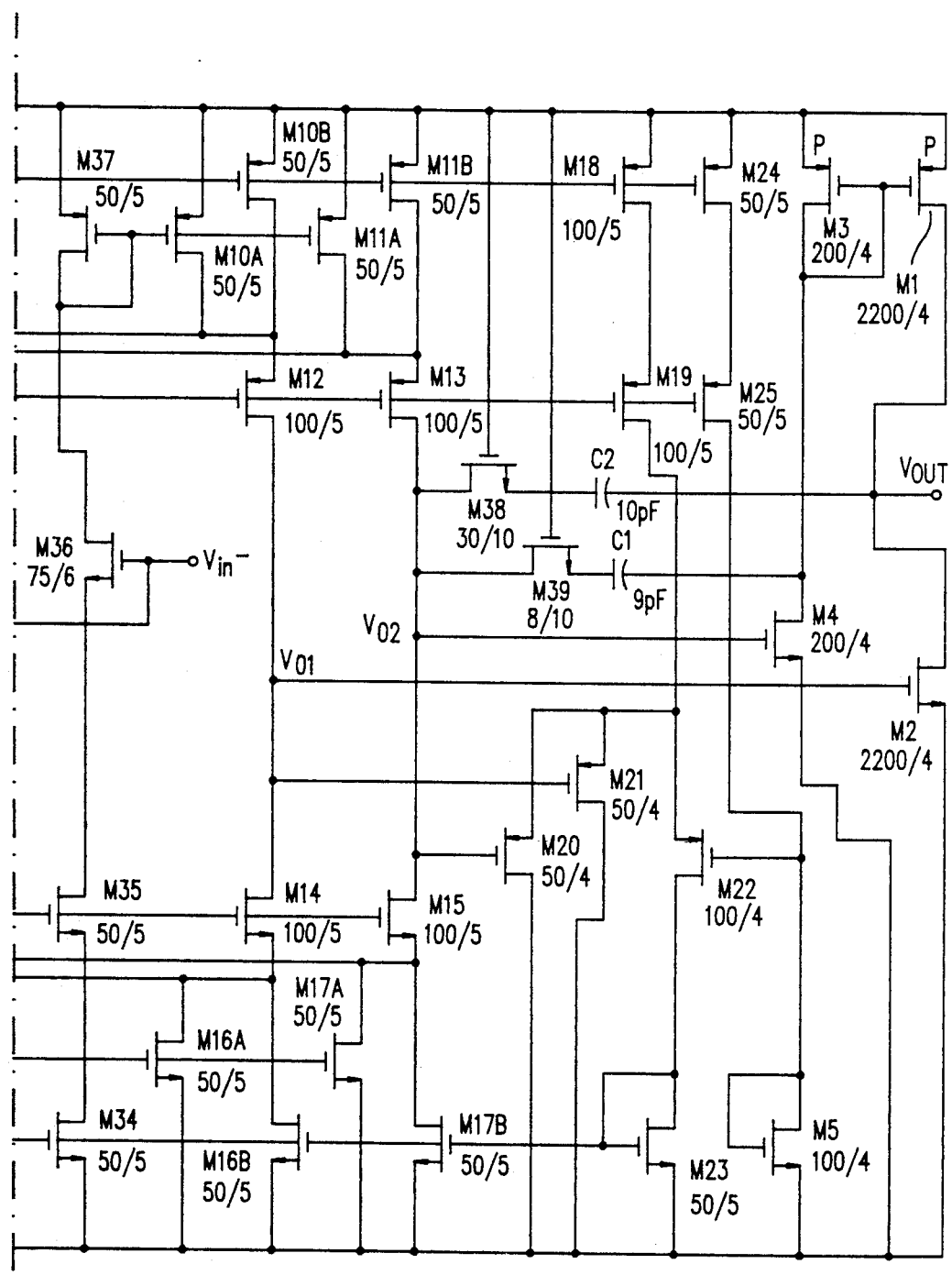

FIG. 2 shows an op amp which incorporates the novel output stage of FIG. 1. As illustrated in FIG. 2, the common-mode input stage includes MOSFET transistors M30-M37, which are connected for receiving the common-mode of differential input signals $V_{in+}$ and $V_{in-}$. The main differential-output input stage includes transistors M6-M17 and M26-M29 and has a defined rail-to-rail input range. The differential input signal is applied to the gates of transistors M26 and M27 of the differential-output input stage. The negative $V_{in-}$ input signal is applied to the N-channel transistor M36 and to the P-channel transistor M32 whereas the $V_{in+}$ signal is passed to M8 and M9. Transistor M26 is coupled through its drain electrode to the $V_{DD}$ rail through transistors M10A and M10B of the differential-output input stage. The source electrodes of M26 and M27 are connected in common and to the voltage source VSS through M28 and M29.

Transistors M30-M37 of the input stage regulate the variations in power dissipation of the op amp relative to the input common mode range. Changes in open loop gain and phase margin relative to the common mode input are effectively reduced by the circuit.

Transistors M40-M47 and resistor $R_b$ constitute the biasing section which is coupled between bias and $V_{ss}$. The source electrodes of M40 and M42 are tied to $V_{ss}$. The resistor $R_b$ is used to set the biasing current which reduces the sensitivity of the circuit to changes in the power supply and in processing variations.

The current in transistors M10A,M10B and M11A,M11B as well as the current in transistors M16A,M16B and M17A,M17B is divided into two components, one being constant and the other being input dependent, i.e., when their corresponding input pair devices turn off that current component becomes zero. The sum of the currents through the pairs M10A,M10B, M11A,M11B, M16A,M16B and M17A,M17B are normally equal to 2I while the currents in M12-M15 are equal to I. When the input common mode voltage increases to $V_{DD}$ or decreases to $V_{ss}$, devices M8, M9, M32 or M26, M27 and M36 are cut off respectively. For the first case in which M8, M9 and M32 are cut off, the current through devices M16A and M17A drops to zero while for the second case in which M26, M27 and M36 are cut off, the current through M10A and M11A reduces to zero. As a result, the currents in M12-M15, voltages $V_{01}$ and $V_{02}$ and hence the bias current in the output devices M1 and M2 become insensitive to the input common mode voltage.

The common mode feedback circuit 12 comprises transistors M18-M23 and is coupled between the differential-output input stage and the output biasing stage preceding the output gain stage. The output biasing stage includes transistors M24, M25 and M5. Frequency compensation is provided by transistors M38, M39 and Miller capacitors C1 and C2 coupled to the output gain stage.

Figure 3A:
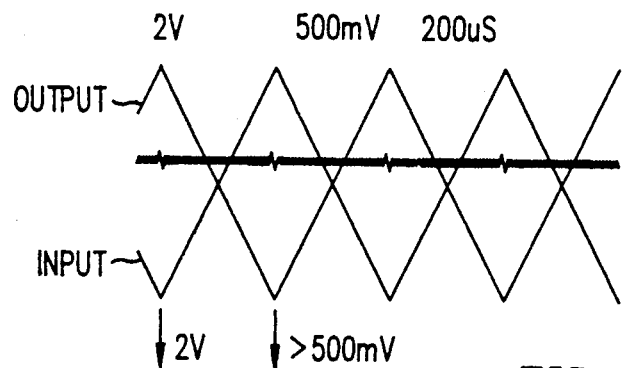
FIGS. 3a and 3b illustrate output waveforms and inverted input waveforms for no load and a 300 ohm load respectively.
Figure 3B:
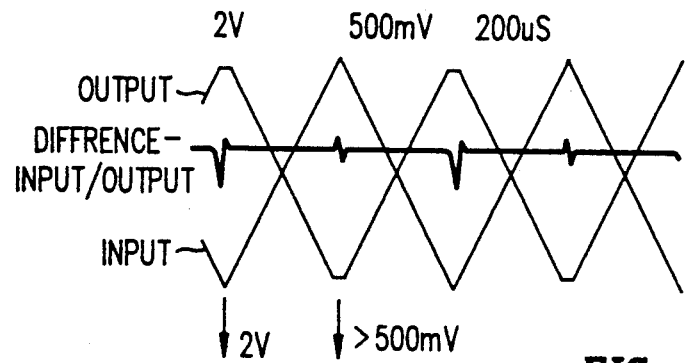

In an implementation of the invention, an op amp was integrated in a PCM codec chip using a 3$\mu$m, double-polyslicon, single-metal, 10 Volt process. The width-/length of each transistor is delineated in FIG. 2 adjacent to the transistor. In order to measure the input voltage range, the op amp was connected in a unity gain feedback configuration. For ±5 V power supplies, a 10 Vpp triangular waveform was applied to the input and the unloaded was measured. The output waveform along with the inverted version of the input waveform and the difference between the input and output signal amplitudes are shown in FIG. 3(a). The input range is rail-to-rail. FIG. 3(b) shows the waveforms when the output is driving a 300 ohm load. The swing loss from the positive side is 400 mV from the negative side it is 200 mV.

The measured characteristics of the op amp are tabulated in Table 1 presented at the end of the specification. The table shows the high values of open-loop gain, common mode rejection ratio (CMRR), total harmonic distortion (THD) and the short circuit sink and source currents. These currents provide an indication of the op amp's driving capability when driving heavy resistive loads. For example, the op amp of this invention can drive a 1.5 Vpp audio signal across an 8 ohm speaker with $-60$ dB of harmonic distortion.

With a power supply voltage of ±5 Volts, power dissipation at zero input was 12 milliWatts (mW), and the variation in power dissipation with input common mode voltage was 2 mW. The mean and standard deviation of the offset voltage was 0.74 milliVolts (mV) and 1.57 mV respectively. The offset changes by only 1 mV when the input is changed from rail-to-rail.

The output stage of this invention is characterized by good current driving capability with smaller size transistors, low standby power dissipation controlled by a current source which can be made supply independent, and a high small-signal transconductance to provide some voltage gain when driving small resistive loads and for moving the capacitive load-dependent pole to higher frequencies. The small-signal transconductance of the output stage is determined only by the N-channel output transistor M2. The circuit configuration of the output stage avoids additional parasitic poles. There is only one parasitic node in addition to the two input nodes and one output node. This makes the circuit suitable for high frequency applications where excess phase shift must be avoided.

It should be understood that the invention is not limited to the specific application set forth above. For example, the op amp of this invention can be used as a unity gain buffer driving a 100 ohm load while using a single 5 Volt supply and the signal swing is 3.85 Volts peak-to-peak. The novel output stage with its smaller transistor devices affords a significantly smaller size op amp.

TABLE 1

Measured Characteristics of the Op Amp

| PARAMETER | VALUE |
| --- | --- |
| Power Supply Voltage | +/−5 Volts |
| Power Dissipation at zero input | 12 mW |
| Variation in Power Dissipation with input common mode voltage | 2 mW |
| Offset Voltage | |
| Mean | 0.74 mV |
| Standard Deviation | 1.57 mV |
| PSRR ($V_{DD}$) | |
| @DC | 87 dB |
| @100 kHz | 35 dB |
| PSSR (Vss) | |
| @DC | 85 dB |
| @100 kHz | 45 dB |
| Open Loop Gain @DC | |
| with 300 ohm load | 88 dB |
| without load | 110 dB |
| CMRR | 100 dB |
| Unity Gain Bandwidth | |
| with 300 ohm ‖ 100 pF load | 2.6 MHz |
| with 100 pF load | 3.7 MHz |
| Phase Margin | |
| with 300 ohm ‖ 100 pF load | 81 deg. |
| with 100 pF load | 47 deg. |
| Slew Rate | |
| Up | 3.3 V/μsec |
| Down | 2.5 V/μsec |
| Voltage swing | |
| no load | −5 V/+5 V |
| 300 ohm load | −4.8 V/+4.6 V |
| THD @1 kHz | |
| 10 Vpp no load | −61 dB |
| 9 Vpp 300 ohm load | −64 dB |
| 7.5 Vpp 300 ohm load | −79 dB |
| Short circuit current | |
| Source | 114 mA |
| Sink | 290 mA |
| Input noise Spectral density @1 kHz | 140 nV/ Hz |
| Area | 600 sq. mils |

What is claimed is:

1. A CMOS operational amplifier comprising:
   a source of differential input signals;
   a differential-output differential-input folded cascode input stage comprising a differential amplifier coupled to said source for providing a differential-output signal;
   a differential input single-ended-output output stage comprising an output biasing coupled to said input stage for determining the common-mode voltage of the differential-output signal of said input stage; and
   a common-mode feedback circuit coupled between said input stage and said output biasing section.

2. A CMOS operational amplifier as in claim 1, wherein said output stage comprises first, second, third and fourth transistors, said first and third transistors being P-channel transistors, said second and fourth transistors being N-channel transistors.

3. A CMOS operational amplifier as in claim 2, wherein said first and second transistors include output or drain electrodes which are connected in common for providing an amplified output signal.

4. A CMOS operational amplifier as in claim 2, including power supply means comprising a first source of positive voltage and a second source of negative voltage; and said output biasing section comprises transistor means including a fifth transistor coupled to the input of said common mode feedback circuit and between said first and second sources of voltage.

5. A CMOS operational ampliifier as in claim 4, wherein said second transistor is connected to negative voltage and said fourth transistor is connected to positive voltage for receiving the differential-output signal of said input stage.

6. A CMOS operational amplifier as in claim 4, wherein the output current in said first and second transistors is dependent upon the sizes of said second and fifth transistor. and the quiescent current through said fifth transistor.

7. A CMOS operational amplifier as in claim 1, including a Miller capacitors for providing frequency compensation.

8. A CMOS operational amplifier as in claim 1, including a main biasing section coupled to the input stage and the output biasing section.

9. A CMOS operational amplifier as in claim 1, wherein said differential-output differential-input stage has a rail-to-rail input range.

10. A CMOS operational amplifier as in claim 1, wherein said output stage comprises output transistors characterized by rail-to-rail gate-to source voltages for a given amount of current.

11. A CMOS operational amplifier as in claim 10, wherein said operational amplifier comprises means for providing good current driving capability for small resistive loads.

12. A CMOS operational amplifier as in claim 1, wherein the input stage as well as the output stage have a rail-to-rail voltage range.

* * * * *